(12) United States Patent
McKeever

(10) Patent No.: US 6,180,323 B1
(45) Date of Patent: Jan. 30, 2001

(54) PHOTOPOLYMERIZABLE COMPOSITIONS HAVING IMPROVED SIDEWALL GEOMETRY AND DEVELOPMENT LATITUDE

(75) Inventor: Mark Robert McKeever, Sayre, PA (US)

(73) Assignee: E. I. du Pont de Nemours and Company, Wilmington, DE (US)

( * ) Notice: Under 35 U.S.C. 154(b), the term of this patent shall be extended for 0 days.

(21) Appl. No.: 09/259,018

(22) Filed: Feb. 26, 1999

Related U.S. Application Data

(63) Continuation-in-part of application No. 08/918,117, filed on Aug. 27, 1997, now Pat. No. 5,962,190.

(51) Int. Cl.$^7$ .................................................. G03F 7/30
(52) U.S. Cl. ..................... 430/325; 430/311; 430/319; 430/281.1
(58) Field of Search .............................. 430/281.1, 325, 430/311, 319

(56) References Cited

U.S. PATENT DOCUMENTS

| | | | |
|---|---|---|---|
| 4,925,768 | 5/1990 | Iwasaki et al. | 430/271 |
| 5,019,483 | 5/1991 | Lin et al. | 430/288 |
| 5,288,589 | 2/1994 | Mc Keever et al. | 430/262 |
| 5,356,754 | 10/1994 | Kushi et al. | 430/288 |
| 5,407,783 | 4/1995 | Caruso | 430/288 |
| 5,650,261 | 7/1997 | Winkle | 430/270.1 |

FOREIGN PATENT DOCUMENTS

| | | | |
|---|---|---|---|
| 0 529 643 A1 | 3/1993 | (EP) | G03F/7/033 |
| 6-214382 | 8/1994 | (JP) | G03F/7/004 |
| 6-324488 | 11/1994 | (JP). | |
| 7-333846 | 12/1995 | (JP). | |
| 4-153275 | 5/1996 | (JP). | |
| WO 92/15628 | 9/1992 | (WO) | C08F/265/06 |

OTHER PUBLICATIONS

English translation of JP 06–324488, Nov. 25, 1994, Kudo et al.*
English translation of JP 06–214382, Aug. 5, 1994, Ueda et al.*
English translation of JP 4–153275, Apr. 26, 1996, Shiego et al.*
Database WPI, Section CH, Week 68, Derwent Publications Ltd., London, GB: AN 1968–97691P XP 0021198485, & SU 190 211 A (Berlin AA), Dec. 24, 1965.
Patent Abstracts of Japan, vol. 16, No. 548 (C–1005), Nov. 18, 1992, & JP 04 209667 A (Hitachi Chem. Co., Ltd.), Aug. 31, 1992.
English Abstracts for JP 6–324488 (Caplus, WPAT).
English Abstracts for JP 6–214382 (Caplus, WPAT).

* cited by examiner

*Primary Examiner*—Janet Baxter
*Assistant Examiner*—Rosemary Ashton

(57) ABSTRACT

Photopolymerizable compositions and associated elements and processes are disclosed herein that upon imaging afford improved sidewall geometry and development latitude. These compositions contain a polymeric binder having the formula:

$$(A)_w(B)_x(C)_y(D)_z$$

where A is a substituted or unsubstituted $C_4$–$C_{10}$ n-alkyl methacrylate, B is a substituted or unsubstituted $C_4$–$C_{10}$ n-alkyl acrylate, C is selected from the group consisting of methyl methacrylate and ethyl methacrylate, and D is selected from the group consisting of methacrylic acid and acrylic acid; and where w, x, y, and z are weight percentages of comonomers in the polymeric binder, w is 5 to 40%, x is 5 to 40%, y is 10 to 70%, and z is 10 to 30%.

6 Claims, No Drawings

US 6,180,323 B1

PHOTOPOLYMERIZABLE COMPOSITIONS HAVING IMPROVED SIDEWALL GEOMETRY AND DEVELOPMENT LATITUDE

RELATED APPLICATION

The present application is a continuation-in-part of application Ser. No. 08/918,117 filed Aug. 27, 1997, now issued U.S. Pat. No. 5,962,190.

FIELD OF THE INVENTION

The invention is in the area of improved photopolymerizable compositions that can be processed to produce a relief image (e.g., an imaged photoresist pattern or an imaged proofing or flexographic printing plate pattern) having improved sidewall geometry and development latitude.

BACKGROUND OF THE INVENTION

Photopolymerizable compositions are used to form a photoresist (or resist) layer on a substrate, such as copper-clad glass epoxy, to allow subsequent selective processing of the substrate, such as selective etching or electroplating. Photopolymerizable compositions are also used to form a permanent solder mask layer on an imaged substrate to protect the underlying circuit lines from solder exposure during the later step of soldering in printed circuit board (PCB) manufacture. The use of photoresists and solder masks for manufacture of printed circuit boards (PCBs) is described in *Photoresist—Materials and Processes,* by William S. DeForest, McGraw-Hill, 1975, in *Printed Circuits Handbook,* edited by Clyde F. Coombs, Jr., McGraw-Hill, 1988 (3rd Edition), and in *Handbook of Printed Circuit Manufacturing* by Raymond H. Clark, Van Nostrand Reinhold, 1985. Photopolymerizable resist materials are known, for example, from U.S. Pat. No. 3,469,982 which describes a film resist with a sandwich structure in the form of a photopolymerizable layer between a cover sheet and a temporary support. Photoresist and solder mask products that have substantially all of the solvent for coating removed are known as dry films. The use of photopolymerizable proofing films for off-press proofing in the printing industry is described in *Principles of Color Proofing,* by Michael H. Bruno, GAMA Communications (Salem, N.H.), 1986. The use of flexographic photopolymer films for use in production of flexographic printing plates is described in *Flexography—Principles and Practices,* Fourth Edition, Foundation of Flexographic Technical Association, (Ronkonkoma, N.Y.), 1992.

As the technology level of printed circuit boards increases towards finer lines/spaces, the demands placed on the photoresist materials used to produce such boards becomes greater. This in turn places a greater burden on the resist formulator to accommodate improved performance, without a decrease in production level or an increase in manufacturing cost of the photoresist product. Similiar considerations apply for use of photopolymerizable compositions in proofing and flexographic printing.

For use in the manufacture of printed circuit boards (PCBs) having fine lines/spaces, it is critical that the photoresist used possess properties such that, upon imaging, the exposed and developed photoresist affords resist patterns having good sidewall geometry (i.e., sidewalls are smooth, planar and form an angle of 90° with respect to the substrate surface, and are free of imperfections such as mousebites, gouges, foot(s), etc.). Photoresists that afford good sidewall geometry will perform better in printed circuit board manufacture than otherwise comparable photoresists that do not afford good sidewall geometry. Photoresists that do afford good sidewall geometry normally exhibit higher resolution, are useful in production of finer line/space PCBs, and give fewer defects and higher yields in printed circuit board manufacture than do otherwise comparable photoresists that do not afford good sidewall geometry.

Photopolymerizable compositions somewhat related to those of this invention are disclosed in 1) Japanese Kokai Patent Application No. HEI 7[1995]-333846 and in 2) Japanese Kokai Patent Application No. HEI 4[1992]-153275. The former (#1) discloses photopolymerizable compositions containing a binder system containing two polymeric binder components and does not include any compositions with a single binder component. The latter (#2) discloses electrodeposition compositions that are made dispersible in aqueous media by neutralization or partial neutralization of the acid functionality of the binder with a basic compound.

While compositions containing two or more binder components, such as those disclosed in Japanese Kokai Patent Application No. HEI 7[1995]-333846, can be useful as photoresists for some applications, they often do have limitations associated with their use, particularly in high resolution applications required to make state of the art PCBs having fine lines and spaces. Particularly, when the two or more binders differ substantially in their properties, such as molecular weight, acid number, etc., then the two or more binders are not fully compatible with each other or the others, and the binders in this event can and often do partially or substantially separate into separate phase domains when the binders are present in the photopolymerizable compositions(s). When such phase separation does occur, it can result in development defects, such as for example, certain domains being more easily washed out during development processing and resulting in an imaged resist having defective sidewalls where there are gouges or mousebites present in the resist sidewall. Such imperfections are highly detrimental toward achieving fine lines/spaces in PCB manufacture with resists having such multiple binders.

There is a continuing need for effective photopolymerizable compostitions having inherent propensities for affording imaged resists having good sidewall geometry and low defect levels, particularly for applications involving generation of imaged photopolymer patterns (e.g., imaged resists) having fine lines/spaces.

SUMMARY OF THE INVENTION

In one embodiment, the invention is a photopolymerizable composition formulated to give good sidewall geometry upon imagewise exposure and development, the photopolymerizable composition consisting essentially of:

(a) a polymeric binder having weight average molecular weight in the range of 20,000 to 160,000, the polymeric binder comprising a polymer having the formula:

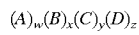

$(A)_w(B)_x(C)_y(D)_z$ where A is a substituted or unsubstituted $C_4$–$C_{10}$ n-alkyl methacrylate, B is a substituted or unsubstituted $C_4$–$C_{10}$ n-alkyl acrylate, C is selected from the group consisting of methyl methacrylate and ethyl methacrylate, and D is selected from the group consisting of methacrylic acid and acrylic acid; and where w, x, y, and z are weight percentages of comonomers in the polymeric binder, w is 5 to 40%, x is 5 to 40%, y is 10 to 70%, and z is 10 to 30%;

(b) at least one ethylenically unsaturated monomer; and (c) at least one component selected from the group consisting of a photoinitiator and a photoinitiator system;

with the proviso that the photopolymerizable composition does not contain a basic compound used for the neutralization or partial neutralization of component (a).

In another embodiment, the invention is a photopolymerizable element for producing a relief image having good sidewall geometry upon imagewise exposure and subsequent development, which comprises:

(1) a support, and
(2) a photopolymerizable composition consisting essentially of:
  (a) a polymeric binder having weight average molecular weight in the range of 20,000 to 160,000, the polymeric binder comprising a polymer having the formula:

$(A)_w(B)_x(C)_y(D)_z$ where A is a substituted or unsubstituted $C_4$–$C_{10}$ n-alkyl methacrylate, B is a substituted or unsubstituted $C_4$–$C_{10}$ n-alkyl acrylate, C is selected from the group consisting of methyl methacrylate and ethyl methacrylate, and D is selected from the group consisting of methacrylic acid and acrylic acid; and where w, x, y, and z are weight percentages of comonomers in the polymeric binder, w is 5 to 40%, x is 5 to 40%, y is 10 to 70%, and z is 10 to 30%;

(b) at least one ethylenically unsaturated monomer; and
  (c) at least one component selected from the group consisting of a photoinitiator and a photoinitiator system;

with the proviso that the photopolymerizable composition does not contain a basic compound used for the neutralization or partial neutralization of component(a).

In another embodiment, the invention is a process for producing a relief image having good sidewall geometry upon imagewise exposure and subsequent development, which comprises the steps of:

(1) preparing a photopolymerizable element comprising a support and a photopolymerizable composition consisting essentially of:
  (a) a polymeric binder having weight average molecular weight in the range of 20,000 to 160,000, the polymeric binder comprising a polymer having the formula:

$(A)_w(B)_x(C)_y(D)_z$ where A is a substituted or unsubstituted $C_4$–$C_{10}$ n-alkyl methacrylate, B is a substituted or unsubstituted $C_4$–$C_{10}$ n-alkyl acrylate, C is selected from the group consisting of methyl methacrylate and ethyl methacrylate, and D is selected from the group consisting of methacrylic acid and acrylic acid; and where w, x, y, and z are weight percentages of comonomers in the polymeric binder, w is 5 to 40%, x is 5 to 40%, y is 10 to 70%, and z is 10 to 30%;

(b) at least one ethylenically unsaturated monomer; and
  (c) at least one component selected from the group consisting of a photoinitiator or photoinitiator system;

with the proviso that the photopolymerizable composition does not contain a basic compound used for the neutralization or partial neutralization of component (a);

(2) applying the photopolymerizable element to a copper clad substrate such that the photopolymerizable composition is in contact with the copper;

(3) imagewise exposing the photopolymerizable element to actinic radiation to afford an imagewise exposed photopolymerized element; and (4) developing the imagewise exposed photopolymerized element of step (2) to form a resist image on the copper clad substrate having good sidewall geometry.

DETAILED DESCRIPTION OF THE INVENTION

Photopolymerizable compositions having improved sidewall geometry and development latitude are disclosed herein together with associated elements and processes. These photopolymerizable compositions comprise (a) a (meth)acrylic copolymeric binder as defined above and below; (b) at least one ethylenically unsaturated monomer; and (c) at least one component selected from the group consisting of a photoinitiator and a photoinitiator system. In addition, other optional components as described infra can be present in these compositions.

(Meth)acrylic Copolymeric Binder

The selection of polymeric binders is critical in this invention in order for the compositions to exhibit good sidewall geometry and broad development latitude. Surprisingly, it has been found that selected (meth)acrylic copolymers having comonomer components that include a substituted or unsubstituted $C_4$–$C_{10}$ n-alkyl methacrylate and a substituted or unsubstituted $C_4$–$C_{10}$ n-alkyl acrylate are key in the compositions of this invention in order to achieve the good sidewall geometry and broad development latitude with respect to comparative (prior art) binders.

Specifically, the binders of this invention are polymers having the formula:

$(A)_w(B)_x(C)_y(D)_z$ where A is a substituted or unsubstituted $C_4$–$C_{10}$ n-alkyl methacrylate, B is a substituted or unsubstituted $C_4$–$C_{10}$ n-alkyl acrylate, C is selected from the group consisting of methyl methacrylate and ethyl methacrylate, and D is selected from the group consisting of methacrylic acid and acrylic acid; and where w, x, y, and z are weight percentages of comonomers in the polymeric binder, w is 5 to 40%, x is 5 to 40%, y is 10 to 70%, and z is 10 to 30%. An alternate range for z is 15 to 30%. Preferably, w is 10 to 40%, x is 10 to 20%, y is 30 to 60%, and z is 20 to 30%. More preferably, w is 22 to 27%, x is 15 to 20%, y is 30 to 40%, and z is 20 to 25%.

The (meth)acrylic copolymeric binders of this invention have a weight average molecular weight ($M_w$) in the range of 20,000 to 160,000. Preferably, $M_w$ is in the range of 40,000 to 100,000, and, more preferably, $M_w$ is in the range of 55,000 to 65,000.

Preferred (meth)acrylic copolymeric binders of this invention are those of the above formula where A is a substituted or unsubstituted $C_4$–$C_8$ n-alkyl methacrylate and B is a substituted or unsubstituted $C_4$–$C_8$ alkyl acrylate. More preferred (meth)acrylic copolymeric binders of this invention are those of the above formula where A is a substituted or unsubstituted $C_4$–$C_6$ n-alkyl methacrylate and B is a substituted or unsubstituted $C_4$–$C_6$ n-alkyl acrylate. The most preferred (meth)acrylic copolymeric binder of this invention is a polymer of the above formula where A is n-butyl methacrylate, B is n-butyl acrylate, C is methyl methacrylate, and D is methacrylic acid.

The quantity of total binder(s) is generally from 40% to 80% parts by weight relative to the total components of a given photopolymerizable composition.

Ethylenically Unsaturated Monomer

The monomer provides the capability to polymerize the photopolymerizable compositions (e.g., photoresists) and contributes to the overall properties of the compositions. In order to effectively do so, the monomer should contain at least one ethylenically unsaturated group capable of undergoing polymerization on exposure to actinic radiation.

The preferred monomeric compounds are polyfunctional, but monofunctional monomers such as (meth)acrylate esters of polycaprolactone can also be used. Suitable monomers which can be used as the sole monomer or in combination with others include the following: 1,4-butanediol diacrylate, 1,5-pentanedioldiacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, glycerol triacrylate, trimethylolpropane triacrylate, pentaerythritol triacrylate, polyoxyethylated trimethylolpropane tri(meth)acrylate, polypropoxylated trimethylolpropane tri(meth)acrylate and similar compounds as disclosed in U.S. Pat. No. 3,380,831, 2,2-di(p-hydroxyphenyl)propane diacrylate, pentaerythritol tetraacrylate, 2,2-di(p-hydroxyphenyl)propane dimethacrylate, triethylene glycol diacrylate, polyoxyethyl-2,2-di(p-hydroxyphenyl)propane dimethacrylate, bisphenol A diacrylate, di-(3-methacryloxy-2-hydroxypropyl)ether of bisphenol A, di-2-methacryloxyethyl ether of bisphenol A, di-(3-acryloxy-2-hydroxypropyl)ether of bisphenol A, di-2-acryloxyethyl ether of bisphenol A, di-(3-methacryloxy-2-hydroxypropyl)ether of tetrachloro-bisphenol A, di-2-methacryloxyethyl ether of tetrachloro-bisphenol A, di-(3-methacryloxy-2-hydroxypropyl)ether of tetrabromo-bisphenol A, di-2-methacryloxyethyl ether of tetrabromo-bisphenol A, di-(3-methacryloxy-2-hydroxypropyl)ether of 1,4-butanediol, triethylene glycol dimethacrylate, trimethylolpropane trimethacrylate, ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, 1,2,4-butanetriol trimethacrylate, 2,2,4-trimethyl-1,3-penatanediol dimethacrylate, pentaerythritol trimethacrylate, 1-phenylethylene- 1,2-dimethacrylate, pentaerythritol tetramethacrylate, 1,5-pentanediol dimethacrylate, 1,4-benzenediol dimethacrylate, 1,3,5-triisopropenyl benzene, and polycaprolactone diacrylate.

Preferred monomers include polyethoxylated trimethylolpropane triacrylate, trimethylolpropane triacrylate, triethylene glycol dimethacrylate, polyethoxylated Bisphenol A dimethacrylate, polypropoxylated propylene glycol monomethacrylate, and polypropoxylated propylene glycol dimethacrylate.

The quantity of total monomer(s) is generally from 10 to 50 parts by weight relative to the total components of a given photopolymerizable composition.

Photoinitiator or Photoinitiator System

A single photoinitiator or a photoiniator system containing multiple components is also present in the photopolymerizable compositions of this invention. The photoinitiator can be of a specific type, such as a halogenated-2,5-cyclohexadienone, benzophenone, alkylaryl ketone or diketone type, or mixtures thereof.

Any of a variety of free radical generating photoinitiators can be used in the current invention. Benzophenone derivatives such as benzophenone, bis-4,4'-dimethylaminobenzophenone (Michler's ketone), bis-4,4'-diethylaminobenzo-phenone (ethyl Michler's ketone), benzophenones singly or multiply substituted with other alkylamino groups, chloro, methoxy, etc. are suitable. Preferred compounds include benzophenone, ethyl Michler's ketone, and Michler's ketone. Also substituted xanthones, thioxanthones, anthrones, and fluorenones are useful initiators, with alkyl, chloro, and alkoxy substituted thioxanthones being preferred. Substituted cyclohexadienones such as those described in Sysak, U.S. Pat. No. 4,341,860 can be also be used, with preferred compounds having both an alkyl and a trichloromethyl substituent in the 4 position.

Useful alkylarylketone derivatives include ketaldonyl alcohols such as benzoin, pivaloin, and acyloin ethers such as benzoin alkyl ethers, benzoin aryl ethers, alpha-hydrocarbon substituted aromatic acyloins, benzoin dialkyl ketals, benzil, benzoin esters, O-acylated oximinoketones, and alpha-amino ketones such as alpha-aminoactophenone derivatives. Substituted or unsubstituted polynuclear quinones such as 9,10-anthroquinones, 1,4-naphthquinones, and phenanthrene quinones are also possible initiators.

Tertiary amines suitable as electron and/or hydrogen donors can also be used as part of the initiating system. Especially preferred are tertiary aromatic amines such as substituted N,N-dialkylaminobenzene derivatives such as ethyl 4-(dimethylamino)benzoate.

Cyclohexadienone compounds useful in this invention are of the formula:

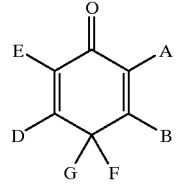

wherein each of A, B, D and E can be hydrogen, an alkyl group of 1 to 9 carbon atoms, bromo, chloro, an aryl group of 6 to 10 carbon atoms, an aralkyl group wherein the aryl moiety is of 6 to 10 carbon atoms and the alkyl moiety is of 1 to 5 carbon atoms, an alkaryl group wherein the aryl moiety is of 6 to 10 carbon atoms and the alkyl moiety is of 1 to 5 carbon atoms, an alkoxy group of 1 to 4 carbon atoms, and A and B and D and E when taken together may form a benzene ring, F is $CCl_3$ or $CHCl_2$; and G can be an alkyl group of 1 to 18 carbon atoms and an aryl group of 6 to 10 carbon atoms. Specific cyclohexadienone compounds, such as 4-methyl-4-trichloromethyl-2,5-cyclohexadienone, are disclosed in Sysak, U.S. Pat. No. 4,341,860, column 2, line 50 to column 3, line 37. The cyclohexadienone compounds can also be used in conjunction with other compounds discussed below as a part of a photoinitiator system.

Useful diketones include biacetyl, 2,3-dibenzoyl-2-norbornene, benzoylbenzal chloride, 2,2-dibromo-2-(phenylsulfonyl)propanedione, alpha-naphthil, 2,3-bornanedione, phenylpuruvic acid and 2,4-pentanedione. Representative quinones that can be used include 4-benzoquinone, 2-benzo-quinonediazide, anthraquinone, 2-methylanthraquinone, 2,6-dimethoxyanthra-quinone, 2,4,8-trichloroanthraquinone, aminoanthraquinone, 1,4-napthoquinone derivatives and phenanthrenequinones.

Also useful as photoinitiators are 2,4,5-triphenylimidazolyl dimers in combination with chain transfer agents, or hydrogen donors, such as are disclosed in U.S. Pat. Nos. 3,479,185; 3,784,557; 4,311,783; and 4,622,286. Preferred hexaarylbiimidazoles (HABI) are 2-ortho-chlorosubstituted hexaphenyl-biimidazoles in which the other positions on the phenyl radicals are unsubstituted or substituted with chloro, methyl or methoxy. Some specific preferred initiators of this class include ortho-chloro-HABI (o-Cl-HABI), i.e., 2,2'-bis(2-chloro-phenyl)-4,4',5,5'-tetraphenyl-1,2'-bi-1H-imidazole; o-EtO-HABI, i.e., 2,2'-bis(2-ethoxyphenyl)-4,4',5,5'-tetraphenyl-1,2'-bi-1H-imidazole; TCTM-HABI, i.e., 2,2',4,4'-tetra(2-chlorophenyl)-5,5'-bis(3,4-dimethoxyphenyl)-1,2'-bi-1H-imidazole; and CDM-HABI, i.e., 2,2'-bis(2-chlorophenyl)-4,4',5,5'-tetrakis(3-methoxyphenyl)1,2'-bi-H-imidazole.

Hydrogen donor compounds that function as chain transfer agents in the photopolymer compositions include:

n-Phenylglycine, 2-mercaptobenzoxazole, 2-mercaptobenzothiazole, 4-methyl-4H-1,2,4-triazole-3-thiol, etc.; as well as various types of compounds, e.g., (a) ethers, (b) esters, (c) alcohols, (d) compounds containing allylic or benzylic hydrogen, (e) acetals, (f) aldehydes, and (g) amides disclosed in column 12, lines 18 to 58 of MacLachlan U.S. Pat. No. 3,390,996. Suitable hydrogen donor compounds for use in systems containing both biimidazole type initiator and N-vinyl carbazole are 5-chloro-2-mercapto-benzothiazole; 2-mercaptobenzothiazole; 1H-1,2,4-triazole-3-thiol; 6-ethoxy-2-mercaptobenzothiazole; 4-methyl-4H-1,2,4-triazole-3-thiol; 1-dodecanethiol; and mixtures thereof.

Some preferred photoinitiators and photosensitizers are selected HABIs (as discussed supra), benzophenone, ethyl Michler's ketone, p-dialkylaminobenz-aldehydes, p-dialkylaminobenzoate alkyl esters, cyclohexadienones, xanthones, thioxanthones, benzil dialkyl ketals, aminoacetophenones, benzoin, benzoin dialkyl ethers, or combinations thereof where alkyl contains 1 to 4 carbon atoms.

The quantity of total photoinitiator(s) or photoinitiator system(s) is generally from 0.5% to 10% parts by weight relative to the total components of a given photopolymerizable composition.

Temporary Support

Any of the support films known for use as such for a photoresist coating can be used in the present invention. The temporary support film, which preferably has a high degree of dimensional stability to temperature changes, may be chosen from a wide variety of polyamides, polyolefins, polyesters, vinyl polymers, and cellulose esters, and may have a thickness of from about 6 to 200 microns. A particularly suitable support film is polyethylene terephthalate having a thickness of about 20 microns.

Optional Materials or Additives

Cover Film

In conventional photoresist elements it is necessary or at least highly desirable to protect the photosensitive layer by a removable cover film (cover sheet) in order to prevent blocking when it is stored in a roll form. The protective cover film is removed prior to lamination of the photoimagable element to a substrate.

The protective cover film may be selected from the same group of high polymer films described for the temporary support film, supra, and may have the same wide range of thicknesses; however, it is preferable to use a cover sheet that has lower adhesion to the photopolymer (e.g., resist) layer relative to the adhesion of the photopolymer to the support (e.g., polyester layer). A cover sheet of 25 microns thick polyethylene or polypropylene is especially suitable.

Other Components

Other compounds conventionally added to photopolymer compositions may also be present in the coating to modify the physical properties of the film. Such components include: adhesion modifiers, thermal stabilizers, photooxidants, colorants such as dyes and pigments, crosslinking agents, viscosity control agents, coating aids, wetting agents, release agents, and the like.

Some heterocyclic chelating compounds, as well as certain other compounds, improve adhesion of the coating to copper-clad substrates and/or prevent residue formation during processing. Suitable heterocyclic components include materials such as those disclosed in Hurley et al., U.S. Pat. No. 3,622,334, Jones, U.S. Pat. No. 3,645,772, and Weed, U.S. Pat. No. 4,710,262. Preferred heterocyclic components include benzotriazole, 5-chlorobenzotriazole, 1-chlorobenzotriazole, 4- and 5-carboxybenzotriazole, 1-hydroxybenzotriazole, 2-mercaptobenzoxazole, 1H- 1,2,4-triazole-3-thiol, 5-amino- 1,3,4-thiodiazole-2-thiol, and mercaptobenzimidazole. Citric acid is an example of a non-heterocyclic chelating compound that is effective in this manner, i.e. to improve adhesion of the coating and/or prevent residue formation.

Various background dyes can be added to the composition to enhance the color of the composition and provide contrast to the copper substrate. Any colorants used should be relatively transparent to the actinic radiation used. In addition the photopolymerization composition can contain various other additives such as adhesion promoters/modifiers, plasticizers, surfactants, dyes, pigments, fillers and other materials which are added to influence characteristics of the composition.

When a photopolymerizable coating is to be used as a permanent resist, such as a solder mask, a chemically or thermally activated crosslinking agent may be incorporated to improve mechanical or chemical properties. Suitable crosslinking agents useful in the present invention are those in the prior art and include those disclosed in Iimure, U.S. Pat. No. 4,961,960 as well as those disclosed in Gervay, U.S. Pat. No. 4,621,043 and Geissler et al., U.S. Pat. No. 4,438,189, such as an adduct of a polyisocyanate compound and an isocyanate group-blocking agent, and formaldehyde condensation resins with melamines, ureas, benzoguanamines and the like.

Photoresist Element Application

In a preferred embodiment, the process of the invention is an imaging process to make resist images on a copper clad substrate to enable subsequent processing steps in the fabrication of printed circuits to occur, such as etching or plating, or a permanent coating to make solder resistant images on a printed circuit board. The type of printed circuit manufactured can be single sided, double sided or of multiple layers.

For the primary imaging process, the photopolymerizable resist coating layer is applied as a liquid or a preformed dry film from a multi-ply, transfer element using a lamination process similar to that described in Celeste, U.S. Pat. No. 3,469,982. The multi-ply, photoresist coating element comprises, in order, a temporary support film, e.g., polyethylene teraphthalate, a photoimageable resist coating, and preferably a removable cover sheet, e.g., polyethylene or polypropylene. The photopolymerizable coating layers of this invention are present in range of total thickness from 10 to 100 microns (0.4 to 4 mils) when used over copper clad substrates. If the cover sheet is present, it is first removed and the uncovered surface of the resist coating is laminated to the pre-cleaned copper clad surface of the substrate using heat and/or pressure, e.g., with a conventional hot-roll laminator. Although the laminate is typically imagewise exposed to actinic radiation through the temporary support film, in some instances, the support film may be removed before imaging to improve resolution and other such properties.

The applied photoimageable resist is then imagewise exposed to actinic radiation to harden or insolubilize exposed areas. Any unexposed areas are then completely removed typically with an aqueous 0.85% sodium carbonate developer solution at 30° C. which selectively dissolves, strips or otherwise disperses the unexposed areas within two minutes without adversely affecting the integrity or adhesion of the exposed areas. The developed resist image on the substrate is then exposed to further processing steps in the fabrication of the circuit, such as electrolytic acid copper plating or a copper etching process. Once the exposed photoresist has performed its function, the resist is then removed from the circuit board generally by an aqueous hydroxide based stripping solution, which may contain organic amines or solvents to improve strip speed or to minimize metal attack or staining.

Development rate of a photoresist is dependent upon the thickness of the photoresist. Thinner resists have faster development rates. Suitable acid comonomer(s) levels of binder(s) in thinner resists for good development characteristics are lower than are the levels in thicker resists that are otherwise comparable. As one non-limiting illustrative example, a resist having a thickness of 0.75 mil or less can have an acid comonomer(s) level from about 10% to about 25%, while a corresponding resist having a thickness of 1–1.2 mils can have an acid comonomer(s) level from about 15% to about 30%.

DEFINITIONS

Good Sidewall Geometry

A good sidewall of an exposed and developed photoresist is one which by visual inspection (a) exhibits substantially no imperfections, i.e. gouges, pits, or mousebites on the wall of the resist or the surface of the resist, (b) exhibits substantially no attack or swelling by the developer solution, especially at the upper edge of the resist and on the walls of the image, (c) has a planar sidewall that lies in a plane perpendicular to the plane of the substrate surface, (d) has substantially no undercutting of the resist at the substrate surface (negative foot), (e) has substantially no growth, especially irregularly, of the base of the resist into areas intended to be free of resist (positive foot), and (f) exhibits these features over a wide range of exposure and development conditions.

Poor Sidewall Geometry

Sidewalls which exhibit one or more defects described above.

Time-to-Clean

The time, in seconds, required for the developer solution to fully wash away, dissolve or disperse unexposed photoresist from the surface of the copper laminate.

Breakpoint

The percentage of distance into a conveyorized spray developer where the unexposed photoresist washes away, dissolves or disperses from the surface of the copper laminate. For example, a 25% breakpoint is one where the unexposed resist is removed 25% of the way through the developer chamber. The imaged areas of the photoresist are in the developer chamber for 4x the time-to-clean. A 75% breakpoint is 75% of the way into the developer chamber. The imaged areas of the photoresist are in the developer only 1.5x the time-to-clean.

Development Latitude

The ability of a resist to reproduce good sidewalls under a variety of exposure and development conditions, including low exposure energy/low percent breakpoint. A resist having good and poor development latitudes will have relatively high and relatively low abilities respectively to reproduce good sidewalls under a variety of exposure and development conditions.

| GLOSSARY* | | |
|---|---|---|
| Comonomers for Binders | | |
| BA | ethyl acrylate | |
| n-BMA | n-butyl methacrylate (= normal-butyl methacrylate) | |
| n-BA | n-butyl acrylate (= normal-butyl acrylate) | |
| MAA | methacrylic acid | |
| MMA | methyl methacrylate | |
| Binders** | | |
| Inventive Binders | | |
| I-1 | n-BA/n-BMA/MMA/MAA (16/25/36/23) | |
| | I-1-a - Lot #1 polymer made by suspension polymerization | |
| | I-1-b - Lot #2 polymer made by suspension polymerization | |
| I-2 | n-BA/n-BMA/MMA/MAA (15/25/41/19) | |
| I-3 | n-BA/n-BMA/MMA/MAA (17/25/33/25) | |
| Comparative Binders | | |
| C-1 | n-BMA/EA/MMA/MAA (25/23/29/23) | |
| C-2a | n-BA/EA/MMA/MAA (20/13/42/25), $M_w$ = 80,000 | |
| C-2b | n-BA/EA/MMA/MAA (20/13/42/25), $M_w$ = 56,000 | |
| C-3 | n-BA/EA/MMA/MAA (15/17/43/25) | |
| C-4 | n-BMA/EA/MMA/MAA (20/25/35/20) | |
| C-5 | n-BMA/EA/MMA/MAA (24/26/27/23) | |
| C-6 | n-BA/EA/MMA/MAA (24/7/44/25) | |
| Other Formulation Components | | |
| Abbreviation | Chemical Name | CAS # |
| TMPEOTA | Trimethylolpropane triethoxylate triacrylate | 28961-43-5 |
| BPAEODMA-6 | Ethoxylated Bisphenol A dimethacrylate (6 moles EO) | 41637-38-1 |
| BPAEODMA-30 | Ethoxylated Bisphenol A dimethacrylate (30 moles EO) | 41637-38-1 |
| PGDMA-400 | Propylene glycol 400 dimethacrylate (7 moles PO) | 25852-49-7 |
| PGMMA | Propypropylene glycol monomethacrylate (5 moles PO) | 39420-45-6 |
| P31R1 | Polyoxyethylene/polyoxypropylene copolymer | 9003-11-6 |

-continued

| | | |
|---|---|---|
| o-Cl-HABI | 2,2'-bis(2-chlorophenyl)-4,4',5,5'-tetraphenyl 1,2'-hi-1H-imidazole | 7189-82-4 |
| EMK | Ethyl Michler's Ketone | 90-93-7 |
| ITX | Isopropylthioxanthone | 5495-84-1 |
| BP | Benzophenone | 119-61-9 |
| LCV | Leuco Crystal Violet | 603-48-5 |
| nPG | n-Phenyl Glycine | 103-01-5 |
| VGD | Victoria Green Dye | 569-64-2 |
| CBT | 50:50 mixture, 4- and 5-Carboxybenzotriazole | 60932-58-3 |
| 5CIBT | 5-Chlorobenzotriazole | 94-97-3 |
| CA | Citric Acid | 77-92-9 |
| BT | Benzotriazole | 95-14-7 |
| DEHA | N,N-Diethylhydroxylamine | 3710-84-7 |
| DG | Dayglo ® 122-9655, Fluorescent green pigment Dayglo Co., Cleveland, OH | |

*The number beside the compound name in each case above is the CAS Registration Number (CAS #) for the given compound.
**For each binder (polymer), the composition is given as the comonomers and weight percentages of comonomers present in the polymer. The weight percentage of each comonomer is given in the same order as the comonomer appears in the list of comonomers for each given polymer $M_w$ = weight average molecular weight of a given polymer.

EXAMPLES

All temperatures are given in degrees Centigrade and all percentages are weight percentages unless indicated otherwise.

All binders (inventive and comparative) were and can be prepared using polymerization techniques (e.g., emulsion, suspension, and/or solution) that are known to those skilled in the polymerization art.

In these examples, a photopolymerizable composition containing a given inventive binder was evaluated on a comparative basis to corresponding photopolymerizable composition containing a given comparative binder (as taught in the prior art). In many of the examples, there are several comparative compositions with each having a different comparative binder.

The general method utilized for preparing and testing samples in these examples was as outlined below unless indicated otherwise in the specific examples.

Coating Solutions

For each set of examples, a stock solution of sufficient quantity was prepared. All coating solutions were prepared in a blend of 88/12 wt. % acetone/methanol at a solids level that gave approximately 50% solids in the solutions to be coated. The stock solution did not contain any of the binders, but did contain all other material (components) for the coating solution.

The stock solution was divided into the appropriate number of individual coating solution samples.

For a given sample, the binder under evaluation was added to that given individual coating solution sample.

The coating solution samples were stirred until all components were dissolved.

Coating

Individual coating solutions were cast with a doctor blade to give the desired dry thickness. All coating solutions were prepared in a blend of 88/12 acetone/methanol at a solids level to give approximately 50% solids in the final coating solution samples.

Coatings were made on a temporary polyester support, typically of 75 gauge thickness.

The cast solution was permitted to air dry at ambient temperature, preferably overnight, to afford each dry film sample for evaluation.

For board coatings, a polyethylene protective layer (coversheet) was not applied.

Each photopolymerizable composition in these examples was coated onto one or both of the following two different polyester samples. One polyester (Polyester 1) was 75 GF Mylar® (E. I. du Pont de Nemours and Company, Wilmington, Del.) and the other (Polyester 2) was Teijin 75G2 polyester (Teijin Limited, Chiyoda-Ku, Tokyo, JAPAN).

Test Sample Preparation

Substrate used was brush scrubbed copper clad glass/epoxy laminate.

Lamination of coatings (dry films) to substrate was done using a DuPont hot roll laminator (DuPont, Wilmington, Del.) operated at 105° C. at a speed of 1.2 meters/minute using standard nip pressure.

Exposure of each dry film sample was done using a DuPont PC530 printer (DuPont Co., Wilmington, Del.) with use of silver artwork having line/space geometries from 20 microns to 200 microns and with exposure energies chosen to hold appropriate step on a Stouffer 41 step wedge.

(Exposure level was characterized by the step held on a Stouffer 41-step tablet and was done through a phototool that afforded upon completion of imaging 100 micron wide photoresist lines.)

Following exposure, development of each exposed dry film sample was done in a developer containing 1% anhydrous sodium carbonate and operated a 30° C. (85° F.) with use of a soft water rinse.

Development speeds were set based on time-to-clean (time required in developer chamber for resist removal) to obtain appropriate breakpoints for each binder under evaluation.

Data was obtained at various exposure levels, development breakpoints, and polyester types.

The developer was a conveyorized developer, Chemcut Model CS2000, Atotech Co., State College, Pa.

Breakpoint, the percentage of the distance into the development chamber of the developer where the resists clears (i.e., is removed from the copper laminate), was determined by visual observation.

SEM Analysis

A given sample for SEM analysis was obtained from 100 micron line/space pairs on developed panels.

SEM used was a model SR5OA SEM unit made by ISI ABT (now known as Topcon), Paramus, N.J.

Micrographs were obtained for each sample at 500× magnification.

Micrographs were rated visually for quality of the imaged photoresist sidewall geometry using the semiquantitative SEM rating scale given below.

SEM Rating Scale

Three sections of resist sidewall were rated—top edge of resist, middle of resist (sidewall), base of resist (at resist/copper interface on a given panel).

Rating scale +2 (best) to −2 (worst) for each section of resist; all are based on visual observations of the micrographs.

Top edge of resist
+2 means no swelling of the line edge.
−2 means very heavy swelling with a pronounced nose. In the worst case, the nose is very wavy with a serrated appearance.

Middle of resist
+2 means smooth sidewall with no visible attack or swelling.
−2 means heavy attack with appearance of gouges or mousebites (i.e. resist portions missing) in the resist.

Base of resist
+2 means no gouges or mousebites with little or no positive or negative foot.
−2 means pronounced positive foot or negative foot with the appearance of mousebites and gouges.

The larger the positive rating, the better the quality of the imaged resist and the higher the propensity for the imaged resist to afford well formed, defect free lines/spaces in PCB manufacture.

Ideally for the best case, a resist should have a perfectly planar sidewall that lies in a plane perpendicular to the plane of the substrate surface (copper laminate). This is the +2 case.

Sum R=numerical sum of the 3 individual ratings for top, middle, and bottom of the resist sidewall. These values are given in the tables of the examples. The estimated error in "Sum R" value is ≦0.9 at 99% confidence level.

EXAMPLE 1

In this example, photopolymerizable compositions designated 1A–E were prepared and evaluated for sidewall quality using the above semiquantitative scale. These compositions were identical except for the choice of binder, which was varied as indicated in Table 1. The other components for these compositions (1A–E) were as listed in Table C-1. The binder compositions are given in the glossary. In this example, binder I-1-a is an inventive binder (within the scope of the invention) while the other binders (C-1, C-2-a, C-2-b, C-3) are comparative binders (outside the scope of the invention). The UV exposure in this example was at a level such that step 14 was held in development with use of a Stouffer 41-step tablet. The development was conducted with a 25% breakpoint. The results obtained are summarized in Table 1.

TABLE 1

| | | | Polyester 1 | | Polyester 2 | |
|---|---|---|---|---|---|---|
| Sample | Binder | Type | T/M/B | Sum R | T/M/B | Sum R |
| 1A | I-1-a | I | 2/0/1 | +3 | 2/1/1 | +4 |
| 1B | C-1 | C | 1/−1/0 | 0 | 1/1/1 | +3 |
| 1C | C-2-a | C | 0/−1/0 | 0 | 0/0/0 | 0 |
| 1D | C-2-b | C | 0/−1/1 | 0 | 1/1/1 | +3 |
| 1E | C-3 | C | 0/0/−1 | −1 | 1/1/1 | +3 |

KEY:
Type = Sample Type: I = Inventive; C = Comparative;
T/M/B = individual rating as defined above for top of resist, middle of resist, and bottom of resist, respectively.
Sum R = numerical sum of the 3 individual ratings for top, middle, bottom of the resist sidewall.

This example illustrates that sample 1A containing the inventive I-1-a binder exhibited significantly improved sidewall geometry relative to the other samples each having a different comparative binder (outside the scope of the invention). The inventive I-1-a binder performed significantly better than the comparative binders with use of either support (Polyester 1 or Polyester 2).

EXAMPLE 2

In this example, photopolymerizable compositions designated 2A–E were prepared and evaluated for sidewall quality using the above semiquantitative scale. These compositions were identical except for the choice of binder, which was varied as indicated in Table 2. The other components for these compositions (2A–E) were as listed in Table C-1. The binder compositions are given in the glossary. In this example, binder I-1 -a is an inventive binder (within the scope of the invention) while the other binders (C-1, C-2-a, C-5, C-6) are comparative binders (outside the scope of the invention). The UV exposure in this example was at a level such that either step 14 or step 19 was held in development with use of a Stouffer 41-step tablet. The development was conducted with a 25% breakpoint. The results obtained are summarized in Table 2.

TABLE 2

| | | | Polyester 1 | | Polyester 2 | |
|---|---|---|---|---|---|---|
| Sample | Binder | Type | T/M/B | Sum R | T/M/B | Sum R |
| 2A | I-1-a | I | 2/1/0 | +3 | 2/1/1 | +4 |
| 2B | C-1 | C | 0/0/0 | 0 | 1/1/1 | +3 |
| 2C | C-2-a | C | −2/−2/−2 | −6 | −1/0/0 | −1 |
| 2D | C-6 | C | −2/−2/−2 | −6 | 0/0/0 | 0 |
| 2E | C-5 | C | −1/−1/−1 | −3 | 0/0/1 | +1 |

KEY:
Type = Sample Type: I = Inventive; C = Comparative;
T/M/B = individual rating as defined above for top of resist, middle of resist, and bottom of resist, respectively.
Sum R = numerical sum of the 3 individual ratings for top, middle, bottom of the resist sidewall.

This example illustrates that sample 2A containing the inventive I-1-a binder exhibited significantly improved sidewall geometry relative to the other samples each having a different comparative binder (outside the scope of the invention). The results for sample 2A with the inventive I-1-a binder were significantly better relative to comparative binder compositions for exposures at both step 14 and step 19 and with use of Polyester 1 as support.

EXAMPLE 3

In this example, photopolymerizable compositions designated 3A–C were prepared and evaluated for sidewall quality using the above semiquantitative scale. These compositions were identical except for the choice of binder, which was varied as indicated in Table 3. The other components for these compositions (3A–C) were as listed in Table C-1. The binder compositions are given in the glossary. In this example, binder I-1-a is an inventive binder (within the scope of the invention) while the other binders (C-1 and C-2-a) are comparative binders (outside the scope of the invention). The UV exposure in this example was at a level such that either step 14 or step 19 was held in development with use of a Stouffer 41-step tablet. The development was conducted with a 25% breakpoint. The results obtained are summarized in Table 3.

TABLE 3

|  |  |  | Polyester 1 step 14 | | Polyester 1 step 19 | |
| --- | --- | --- | --- | --- | --- | --- |
| Sample | Binder | Type | T/M/B | Sum R | T/M/B | Sum R |
| 3A | I-1-a | I | 2/0/0 | +2 | 2/0/1 | +3 |
| 3B | C-1 | C | 0/0/−1 | −1 | 1/0/1 | +2 |
| 3C | C-2-a | C | −1/−1/−1 | −3 | 0/0/1 | +1 |

KEY:
Type = Sample Type: I = Inventive; C = Comparative;
T/M/B = individual rating as defined above for top of resist, middle of resist, and bottom of resist, respectively.
Sum R = numerical sum of the 3 individual ratings for top, middle, bottom of the resist sidewall.

This example illustrates that sample 3A containing the inventive I-1-a binder exhibited significantly improved sidewall geometry relative to the other samples (3B and 3C) each having a different comparative binder (outside the scope of the invention). The results for sample 3A with the inventive I-1-a binder were significantly better relative to comparative binder compositions for exposures at both step 14 and step 19.

EXAMPLE 4

In this example, photopolymerizable compositions designated 4D F were prepared and evaluated for sidewall quality using the above semiquantitative scale. These compositions were identical except for the choice of binder, which was varied as indicated in Table 4. The other components for these compositions (4D–F) were as listed in Table C-1. The binder compositions are given in the glossary. In this example, binder I-1-a is an inventive binder (within the scope of the invention) while the other binders (C-1 and C-2-a) are comparative binders (outside the scope of the invention). The UV exposure in this example was at a level such that either step 14 or step 19 was held in development with use of a Stouffer 41-step tablet. The development was conducted with a 25% breakpoint. The results that were obtained are summarized in Table 4.

TABLE 4

|  |  |  | Polyester 1 step 14 | | Polyester 1 step 19 | |
| --- | --- | --- | --- | --- | --- | --- |
| Sample | Binder | Type | T/M/B | Sum R | T/M/B | Sum R |
| 4D | I-1-a | I | 2/0/1 | +3 | 2/0/1 | +3 |
| 4E | C-1 | C | 0/−1/−2 | −3 | 1/0/−1 | 0 |
| 4F | C-2-a | C | −1/−1/−2 | −4 | 1/0/−1 | 0 |

KEY:
Type = Sample Type: I = Inventive; C = Comparative;
T/M/B = individual rating as defined above for top of resist, middle of resist, and bottom of resist, respectively.
Sum R = numerical sum of the 3 individual ratings for top, middle, bottom of the resist sidewall.

This example illustrates that sample 4D containing the inventive I-1-a binder exhibited significantly improved sidewall geometry relative to the other samples (4E or 4F) each having a different comparative binder (outside the scope of the invention). The results for sample 4D with the inventive I-1-a binder were significantly better relative to comparative binder compositions for exposures at both step 14 and step 19 and both with a 25% development breakpoint.

EXAMPLE 5

In this example, photopolymerizable compositions designated 5A–C were prepared and evaluated for sidewall quality using the above semiquantitative scale. These compositions were identical except for the choice of binder, which was varied as indicated in Table 5. The other components for these compositions (5A–C) were as listed in Table C-1. The binder compositions are given in the glossary. In this example, binder I-1-a is an inventive binder (within the scope of the invention) while the other binders (C-1 and C-2-a) are comparative binders (outside the scope of the invention). The UV exposure in this example was at a level such that either step 14 or step 19 was held in development with use of a Stouffer 41-step tablet. The development was conducted with a 75% breakpoint. The results that were obtained are summarized in Table 5.

TABLE 5

|  |  |  | Polyester 1 step 14 | | Polyester 1 step 19 | |
| --- | --- | --- | --- | --- | --- | --- |
| Sample | Binder | Type | T/M/B | Sum R | T/M/B | Sum R |
| 5A | I-1-a | I | 2/1/1 | +4 | 2/1/1 | +4 |
| 5B | C-1 | C | 0/0/0 | 0 | 1/1/0 | +2 |
| 5C | C-2-a | C | −1/−1/−1 | −3 | 0/1/1 | +2 |

KEY:
Type = Sample Type: I = Inventive; C = Comparative;
T/M/B = individual rating as defined above for top of resist, middle of resist, and bottom of resist, respectively.
Sum R = numerical sum of the 3 individual ratings for top, middle, bottom of the resist sidewall.

This example illustrates that sample 5A containing the inventive I-1-a binder exhibited significantly improved sidewall geometry relative to the other samples each having a different comparative binder (outside the scope of the invention). The results for sample 5A with the inventive I-1-a binder were significantly better relative to comparative binder compositions (5B and 5C) for exposures at both step 14 and step 19 and both with a 75% development breakpoint.

EXAMPLE 6

In this example, photopolymerizable compositions designated 6D–F were prepared and evaluated for sidewall quality using the above semiquantitative scale. These compositions were identical except for the choice of binder, which was varied as indicated in Table 6. The other components for these compositions (6D–F) were as listed in Table C-1. The binder compositions are given in the glossary. In this example, binder I-1-a is an inventive binder (within the scope of the invention) while the other binders (C-1 and C-2-a) are comparative binders (outside the scope of the invention). The UV exposure in this example was at a level such that either step 14 or step 19 was held in development with use of a Stouffer 41-step tablet. The development was conducted with a 75% breakpoint. The results that were obtained are summarized in Table 6.

TABLE 6

|  |  |  | Polyester 1 step 14 | | Polyester 1 step 19 | |
| --- | --- | --- | --- | --- | --- | --- |
| Sample | Binder | Type | T/M/B | Sum R | T/M/B | Sum R |
| 6D | I-1-a | I | 2/1/2 | +5 | 2/0/2 | +4 |
| 6E | C-1 | C | 1/0/1 | +2 | 2/0/2 | +4 |
| 6F | C-2-a | C | 0/0/1 | +1 | 1/0/1 | +2 |

KEY:
Type = Sample Type: I = Inventive; C = Comparative;
T/M/B = individual rating as defined above for top of resist, middle of resist, and bottom of resist, respectively.
Sum R = numerical sum of the 3 individual ratings for top, middle, bottom of the resist sidewall.

This example illustrates that sample 6D containing the inventive I-1-a binder exhibited significantly improved sidewall geometry relative to the other samples each having a different comparative binder (outside the scope of the invention). The results for sample 6D with the inventive I-1-a binder were significantly better relative to comparative binder compositions for exposures at both step 14 and step 19 and both with a 75% development breakpoint.

EXAMPLE 7

In this example, photopolymerizable compositions designated 7A–D were prepared and evaluated for sidewall quality using the above semiquantitative scale. These compositions were identical except for the choice of binder and the choice of photoinitiator, which were varied as indicated in Table 7. All components for these compositions (7A–D) were as listed in Table C-2 (except for the specific binder, which was varied as designated in Table 7). The binder compositions are given in the glossary. In this example, binder I-1-a is an inventive binder (within the scope of the invention) while the other binder (C-2-a) is a comparative binder (outside the scope of the invention). The UV exposure in this example was at a level such that either step 14 or step 19 was held in development with use of a Stouffer 41-step tablet. The development was conducted with a 75% breakpoint. The results that were obtained are summarized in Table 7.

TABLE 7

|        |        |      | Polyester 1 step 14 | | Polyester 1 step 19 | |
|--------|--------|------|-------|-------|-------|-------|
| Sample | Binder | Type | T/M/B | Sum R | T/M/B | Sum R |
| 7A     | I-1-a  | I    | 2/1/1 | +4    | 2/1/1 | +4    |
| 7B     | C-2-a  | C    | −1/−1/1 | −1  | −1/−1/0 | −2  |
| 7C     | I-1-a  | I    | 2/1/0 | +3    | 2/1/1 | +4    |
| 7D     | C-2-a  | C    | 1/1/0 | +2    | 1/0/1 | +2    |

KEY:
Type = Sample Type: I = Inventive; C = Comparative;
T/M/B = individual rating as defined above for top of resist, middle of resist, and bottom of resist, respectively.
Sum R = numerical sum of the 3 individual ratings for top, middle, bottom of the resist sidewall.

Samples 7A,B used a benzophenone-based photoinitiator system.
Samples 7C,D used an o-Cl-HABI-based photoinitiator system.

This example illustrates that photopolymerizable compositions having either of two different photoinitiator systems with the inventive I-1-a binder exhibited significantly improved sidewall geometry relative to comparable compositions having a comparative, non-inventive binder (C-2-a). All developments in this example were at 75% breakpoint.

EXAMPLE 8

This example illustrates that each of three different inventive binders (I-1-a, I-2, and I-3), when present in a photopolymerizable composition with a relatively low propensity for crosslinking compared to Example 8, gave superior sidewall geometry relative to a comparative binder being present in the same photopolymerizable composition. In this example, photopolymerizable compositions designated 8A–D were prepared and evaluated for sidewall quality using the above semiquantitative scale. These compositions were identical except for the choice of binder, which was varied as indicated in Table 8. All components for these compositions (8A–D) were as listed in Table C-2 (except for the specific binder, which was varied as designated in Table 8). The binder compositions are given in the glossary. In this example, binders I-1-a, I-2, and I-3 are inventive binders (within the scope of the invention) while the other binder (C-2-a) is a comparative binder (outside the scope of the invention). The UV exposure in this example was at a level such that step 19 was held in development with use of a Stouffer 41-step tablet. The development (independently) was conducted with either a 25% breakpoint (BP) or a 75% breakpoint (BP). The results that were obtained are summarized in Table 8.

TABLE 8

|        |        |      | Polyester 1 25% BP | | Polyester 1 7% BP | |
|--------|--------|------|-------|-------|-------|-------|
| Sample | Binder | Type | T/M/B | Sum R | T/M/B | Sum R |
| 8A     | I-1-a  | I    | 2/0/1 | +3    | 1/1/2 | +4    |
| 8B     | I-2    | I    | 2/1/1 | +4    | 1/1/2 | +4    |
| 8C     | I-3    | I    | 2/1/1 | +4    | 1/1/2 | +4    |
| 8D     | C-2-a  | C    | 0/0/1 | +1    | 0/0/2 | +2    |

KEY:
Type = Sample Type: I = Inventive; C = Comparative;
T/M/B = individual rating as defined above for top of resist, middle of resist, and bottom of resist, respectively.
Sum R = numerical sum of the 3 individual ratings for top, middle, bottom of the resist sidewall.

Photopolymerizable samples 8A–D had a lower propensity for crosslinking relative to samples 8E–H (see Table 9).

This example illustrates that samples 8A, 8B, and 8C containing, respectively, the inventive I-1-a, I-2, and I-3 binders exhibited significantly improved sidewall geometry relative to the 8D sample having a comparative binder (C-2-a binder - outside the scope of the invention).

EXAMPLE 9

This example illustrates that each of three different inventive binders (I-1-a, I-2, and I-3), when present in a photopolymerizable composition with a relatively high propensity for crosslinking compared to Example 8 gave superior sidewall geometry relative to a comparative binder being present in the same photopolymerizable composition. In this example, photopolymerizable compositions designated 9E–H were prepared and evaluated for sidewall quality using the above semiquantitative scale. These compositions were identical except for the choice of binder, which was varied as indicated in Table 9. All components for these compositions (9E–H) were as listed in Table C-2 (except for the specific binder, which was varied as designated in Table 9). The binder compositions are given in the glossary. In this example, binders I-1-a, I-2, and I-3 are inventive binders (within the scope of the invention) while the other binder (C-2-a) is a comparative binder (outside the scope of the invention). The UV exposure in this example was at a level such that step 19 was held in development with use of a Stouffer 41-step tablet. The development (independently) was conducted with either a 25% breakpoint (BP) or a 75% breakpoint (BP). The results that were obtained are summarized in Table 9.

TABLE 9

|        |        |      | Polyester 1 25% BP | | Polyester 1 75% BP | |
|--------|--------|------|-------|-------|-------|-------|
| Sample | Binder | Type | T/M/B | Sum R | T/M/B | Sum R |
| 9E     | I-1-a  | I    | 2/1/1 | +4    | 1/1/2 | +4    |
| 9F     | I-2    | I    | 1/1/1 | +3    | 1/1/2 | +4    |

TABLE 9-continued

| | | | Polyester 1 25% BP | | Polyester 1 75% BP | |
|---|---|---|---|---|---|---|
| Sample | Binder | Type | T/M/B | Sum R | T/M/B | Sum R |
| 9G | I-3 | I | 2/1/1 | +4 | 2/1/2 | +5 |
| 9H | C-2-a | C | 0/0/0 | 0 | 0/1/1 | +2 |

KEY:
Type = Sample Type: I = Inventive; C = Comparative;
T/M/B = individual rating as defined above for top of resist, middle of resist, and bottom of resist, respectively.
Sum R = numerical sum of the 3 individual ratings for top, middle, bottom of the resist sidewall.

Photopolymerizable samples 9E–H had a higher propensity for crosslinking relative to samples 9A–D (see Table 8).

This example illustrates that samples 9E, 9F, and 9G containing, respectively, the inventive I-1-a, I-2 or I-3 binders exhibited significantly improved sidewall geometry relative to the 9H sample having a comparative binder (C-2-a binder - outside the scope of the invention).

EXAMPLE 10

This example illustrates that photopolymerizable compositions having a range of photospeeds that contain an inventive binder all exhibit improved sidewall geometry relative to corresponding comparative compositions having a comparative binder. In this example, photopolymerizable compositions designated 10A–I were prepared and evaluated for sidewall quality using the above semiquantitative scale. These compositions were such that 10A–D contained the comparative binder C-2-a and increased in photospeed in going from 10A through 10D in alphabetical order. Similarly, compositions 10E–I were such that 10E–I contained the inventive binder I-1-a and increased in photospeed in going from 10E through 10I in alphabetical order. All components for these compositions (10A–I) were as listed in Table C-3 (except for the specific binder, which was varied as designated in Table 10). The binder compositions are given in the glossary. In this example, binder I-1-a is an inventive binder (within the scope of the invention) while the other binder (C-2-a) is a comparative binder (outside the scope of the invention). The UV exposure in this example was at a level such that either step 19 or step 26 was held in development with use of a Stouffer 41-step tablet. The development was conducted with a 50% breakpoint (BP). The results that were obtained are summarized in Table 10.

TABLE 10

| | | | Polyester 2 step 19 | | Polyester 2 step 26 | |
|---|---|---|---|---|---|---|
| Sample | Binder | Type | T/M/B | Sum R | T/M/B | Sum R |
| 10A | C-2-a | C | 0/1/1 | +2 | 1/2/2 | +5 |
| 10B | C-2-a | C | 0/1/−1 | 0 | 1/2/1 | +4 |
| 10C | C-2-a | C | −1/−1/−1 | −3 | 1/1/0 | +2 |
| 10D | C-2-a | C | −2/−2/−2 | −6 | 1/1/1 | +3 |
| 10E | I-1-a | I | 2/2/2 | +6 | 2/2/2 | +6 |
| 10F | I-1-a | I | 2/2/2 | +6 | 2/2/2 | +6 |
| 10G | I-1-a | I | 2/2/2 | +6 | 2/2/2 | +6 |
| 10H | I-1-a | I | 2/2/2 | +6 | 2/2/2 | +6 |
| 10I | I-1-a | I | 2/0/0 | +2 | 2/1/1 | +4 |

KEY:
Type = Sample Type: I = Inventive; C = Comparative;
T/M/B = individual rating as defined above for top of resist, middle of resist, and bottom of resist, respectively.
Sum R = numerical sum of the 3 individual ratings for top, middle, bottom of the resist sidewall.

Note: All development was at 50% BP in this example.

In this example, there is a photospeed increase from sample 10A to sample 10D in alphabetical order; there is also an increase in photospeed from sample 10E to 10I in alphabetical order. Samples 10A–D correspond to samples 10E–H except for the binder change (as indicated in Table 10).

The example illustrates that samples 10E–I having the inventive I-1-a binder exhibited significantly improved sidewall geometry relative to the samples 10A–D, which have a comparative binder (C-2-a, which is outside the scope of the invention). Excellent sidewall geometry and development latitude was maintained throughout the series 10E–I as the photospeed increased in sharp contrast to comparative samples 10A–D. This improved performance of each sample with an inventive binder relative to that of an otherwise comparable sample with a comparative binder was especially pronounced at higher photospeeds.

EXAMPLE 11

In this example, photopolymerizable compositions designated 11A–P were prepared and evaluated for sidewall quality using the above semiquantitative scale. These compositions were identical except for the choice of chelator or chelator system, which was varied as indicated in Table 11. The chelator(s) tested in this example were 1) none in samples 11A–D, 2) 5-chlorobenzotriazole/citric acid in samples 11E–H, 3) 5-chlorobenzotriazole/4,5-carboxybenzotriazole in samples I–L, and 4) benzotriazole in samples M–P. The components for these compositions (11A–P) were as listed in Table C-4. The binder compositions are given in the glossary. In this example, binder I-1-a and I-3 are inventive binders (within the scope of the invention) while three other binders (C-2-a, C-4, and C-8) are comparative binders (outside the scope of the invention). The UV exposure in this example was at a level such that step 19 was held in development with use of a Stouffer 41-step tablet. The development in each case was conducted with a 25% breakpoint (BP) and with a 50% breakpoint (BP). The results that were obtained are summarized in Table 11.

TABLE 11*

| | | | 25% BP, step 19 | | 50% BP, step 19 | |
|---|---|---|---|---|---|---|
| Sample | Binder | Type | T/M/B | Sum R | T/M/B | Sum R |
| 11A | I-1-a | I | 1/1/0 | +2 | 2/1/1 | +4 |
| 11B | C-2-a | C | −2/−2,/−1 | −5 | −2/−2/0 | −4 |
| 11C | C-4 | C | 0/1/1 | +2 | 0/−1/−2 | −3 |
| 11D | I-3 | I | 1/1/1 | +3 | 2/1/1 | +4 |
| 11E | I-1-a | I | 2/1/1 | +4 | 2/1/1 | +4 |
| 11F | C-2-a | C | −2/−2/−1 | −5 | −2/−2/−1 | −5 |
| 11G | C-4 | C | 0/1/1 | +2 | 0/0/−1 | −1 |
| 11H | C-8 | C | 1/1/1 | +3 | 1/1/1 | +3 |
| 11I | I-1-a | I | 1/1/1 | +3 | 2/1/1 | +4 |
| 11J | C-2-a | C | −2/−1/0 | −3 | −2/−2/0 | −4 |
| 11K | C-4 | C | 0/1/0 | +1 | 1/1/1 | +3 |
| 11L | C-8 | C | 0/1/1 | +2 | 0/1/1 | 2 |
| 11M | I-1-a | I | 1/1/0 | +2 | 1/1/1 | +3 |
| 11N | C-2-a | C | −2/−1/−1 | −4 | −1/−1/−1 | −3 |
| 11O | C-4 | C | 0/1/−1 | 0 | 0/1/0 | +1 |
| 11P | I-3 | I | 1/1/1 | +3 | 2/1/1 | +4 |

KEY:
Type = Sample Type: I = Inventive; C = Comparative;
T/M/B = individual rating as defined above for top of resist, middle of resist, and bottom of resist, respectively.
Sum R = numerical sum of the 3 individual ratings for top, middle, bottom of the resist sidewall.
*Polyester type 2 was used.

This example illustrates that, for comparable samples containing either no chelator(s) or one of three different chelator(s) (i.e., 5C1BT/CA, 5C1BT/CBT, and BT), the samples containing either of the inventive I-1-a or I-3 binders exhibited much better sidewall geometry in relation to comparable samples with a comparative binder (either C-2-a or C-4 or C-8).

TABLE C-1

| Component | Sample Compositions (Parts by weight)* | | | |
|---|---|---|---|---|
| | 1A-E | 2A-E | 3A-C:5A-C | 4D-F:6D-F |
| TMPEOTA | 12 | 12 | 12 | 12 |
| BPAEODMA-30 | 9 | 9 | 9 | — |
| BPAEODMA-6 | — | — | — | 9 |
| PGDMA-400 | 6.4 | 6.4 | 6.4 | 12.4 |
| PGMMA | 3 | 3 | 3 | 4 |
| P31R1 | — | — | — | 3 |
| EMK | 0.06 | 0.06 | 0.06 | 0.08 |
| o-Cl-HABI | 3 | 3 | 3 | 3 |
| ITX | 0.4 | 0.4 | 0.4 | 0.4 |
| LCV | 0.3 | 0.3 | 0.3 | 0.35 |
| nPG | 0.05 | 0.05 | 0.05 | 0.05 |
| VGD | 0.04 | 0.04 | 0.04 | 0.05 |
| CBT | 0.02 | 0.02 | 0.02 | 0.02 |
| 5CIBT | 0.01 | 0.01 | 0.01 | 0.01 |
| DEHA | 0.02 | 0.02 | 0.02 | 0.02 |
| DG | — | — | — | — |
| Binder | 65.7 | 65.7 | 65.7 | 55.6 |
| Total | 100 | 100 | 100 | 99.98 |

*All compositions are for the coated and dried photopolymer films (with substantially all of the coating solvent(s) having been removed)

TABLE C-2

| Component | Sample Compositions (Parts by weight)* | | | |
|---|---|---|---|---|
| | 7A-B | 7C-D | 8A-D | 9E-H |
| TMPEOTA | 12 | 10 | 12 | 15 |
| BPAEODMA-30 | 9 | — | 9 | 9 |
| BPAEODMA-6 | — | 9 | — | — |
| PGDMA-400 | 6.4 | 12.4 | 6.4 | 6.4 |
| PGMMA | 3 | 4 | 3 | — |
| P31R1 | 2 | 3 | — | — |
| EMK | 0.2 | 0.08 | 0.06 | 0.06 |
| o-Cl-HABI | 2 | 3 | 3 | 3 |
| ITX | — | 0.4 | 0.4 | 0.4 |
| LCV | 0.5 | 0.35 | 0.3 | 0.3 |
| nPG | 0.1 | 0.05 | 0.05 | 0.05 |
| BP | 4 | — | — | — |
| VGD | 0.04 | 0.05 | 0.04 | 0.04 |
| CBT | 0.02 | 0.02 | 0.02 | 0.02 |
| SCIBT | 0.01 | 0.01 | 0.01 | 0.01 |
| DEHA | 0.02 | 0.02 | 0.02 | 0.02 |
| DG | — | — | — | — |
| Binder | 65.7 | 57.6 | 65.7 | 65.7 |
| Total | 104.99 | 99.98 | 100 | 100 |

*All compositions are for the coated and dried photopolymer films (with substantially all of the coating solvent(s) having been removed)

TABLE C-3

| Component | Sample Compositions (parts by weight)* | | | | | | | | |
|---|---|---|---|---|---|---|---|---|---|
| | 10A | 10B | 10C | 10D | 10E | 10F | 10G | 10H | 10I |
| TMPEOTA | 12 | 12 | 12 | 12 | 12 | 12 | 12 | 12 | 12 |
| BPAEODMA-30 | 9 | 9 | 9 | 9 | 9 | 9 | 9 | 9 | 9 |
| PGDMA-400 | 6.4 | 6.4 | 6.4 | 6.4 | 6.4 | 6.4 | 6.4 | 6.4 | 6.4 |
| PGMMA | 3 | 3 | 3 | 3 | 3 | 3 | 3 | 3 | 3 |
| EMK | 0.06 | 0.06 | 0.06 | 0.06 | 0.06 | 0.06 | 0.06 | 0.06 | 0.06 |
| o-Cl-HABI | 3 | 3 | 3 | 4 | 3 | 3 | 3 | 4 | 3 |
| ITX | 0.4 | 0.4 | 0.4 | 0.4 | 0.4 | 0.4 | 0.4 | 0.4 | 0.4 |
| LCV | 0.3 | 0.3 | 0.3 | 0.3 | 0.3 | 0.3 | 0.3 | 0.3 | 0.3 |
| nPG | 0.05 | 0.1 | 0.2 | 0.2 | 0.05 | 0.1 | 0.2 | 0.2 | 0.45 |
| VGD | 0.04 | 0.04 | 0.04 | 0.04 | 0.04 | 0.04 | 0.04 | 0.04 | 0.04 |
| CBT | 0.02 | 0.02 | 0.02 | 0.02 | 0.02 | 0.02 | 0.02 | 0.02 | 0.02 |
| 5CIBT | 0.01 | 0.01 | 0.01 | 0.01 | 0.01 | 0.01 | 0.01 | 0.01 | 0.01 |
| DEHA | 0.02 | 0.02 | 0.02 | 0.02 | 0.02 | 0.02 | 0.02 | 0.02 | 0.02 |
| Binder | 65.7 | 65.7 | 65.7 | 65.7 | 65.7 | 65.7 | 65.7 | 65.7 | 65.7 |
| Total | 100 | 100.05 | 100.15 | 10.15 | 100 | 100.05 | 100.15 | 101.15 | 100.40 |

*All compositions are for the coated and dried photopolymer films (with substantially all of the coating solvent(s) having been removed)

TABLE C-4

Sample Compositions (Parts by Weight)*

| Component | 11A | 11B | 11C | 11D | 11E | 11F | 11G | 11H | 11I | 11J | 11K | 11L | 11M | 11N | 11O | 11P |
|---|---|---|---|---|---|---|---|---|---|---|---|---|---|---|---|---|
| TMPEOTA | 12 | 12 | 12 | 12 | 12 | 12 | 12 | 12 | 12 | 12 | 12 | 12 | 12 | 12 | 12 | 12 |
| BPAEODMA-30 | 9 | 9 | 9 | 9 | 9 | 9 | 9 | 9 | 9 | 9 | 9 | 9 | 9 | 9 | 9 | 9 |
| PGMDA-400 | 6.4 | 6.4 | 6.4 | 6.4 | 6.4 | 6.4 | 6.4 | 6.4 | 6.4 | 6.4 | 6.4 | 6.4 | 6.4 | 6.4 | 6.4 | 6 |
| PGMMA | 3 | 3 | 3 | 3 | 3 | 3 | 3 | 3 | 3 | 3 | 3 | 3 | 3 | 3 | 3 | 3 |
| EMK | 0.06 | 0.06 | 0.06 | 0.06 | 0.06 | 0.06 | 0.06 | 0.06 | 0.06 | 0.06 | 0.06 | 0.06 | 0.06 | 0.06 | 0.06 | 0.06 |
| o-Cl-HABI | 4 | 4 | 4 | 4 | 4 | 4 | 4 | 4 | 4 | 4 | 4 | 4 | 4 | 4 | 4 | 4 |
| ITX | 0.4 | 0.4 | 0.4 | 0.4 | 0.4 | 0.4 | 0.4 | 0.4 | 0.4 | 0.4 | 0.4 | 0.4 | 0.4 | 0.4 | 0.4 | 0.4 |
| nPG | 0.2 | 0.2 | 0.2 | 0.2 | 0.2 | 0.2 | 0.2 | 0.2 | 0.2 | 0.2 | 0.2 | 0.2 | 0.2 | 0.2 | 0.2 | 0.2 |
| LCV | 0.3 | 0.3 | 0.3 | 0.3 | 0.3 | 0.3 | 0.3 | 0.3 | 0.3 | 0.3 | 0.3 | 0.3 | 0.3 | 0.3 | 0.3 | 0.3 |
| VGD | 0.04 | 0.04 | 0.04 | 0 | 0.04 | 0.04 | 0.04 | 0.04 | 0.04 | 0.04 | 0.04 | 0.04 | 0.04 | 0.04 | 0.04 | 0.04 |
| 5ClBT | 0 | 0 | 0 | 0 | 0 | 0 | 0 | 0 | 0.01 | 0.01 | 0.01 | 0.01 | 0 | 0 | 0 | 0 |
| BT | 0 | 0 | 0 | 0 | 0 | 0 | 0 | 0 | 0.02 | 0.02 | 0.02 | 0.02 | 0 | 0 | 0 | 0 |
| CA | 0 | 0 | 0 | 0 | 0.05 | 0.05 | 0.05 | 0.05 | 0 | 0 | 0 | 0 | 0.1 | 0.1 | 0.1 | 0.1 |
| Binder | 64.67 | 64.67 | 64.67 | 64.67 | 64.67 | 64.67 | 64.67 | 64.67 | 64.67 | 64.67 | 64.67 | 64.67 | 64.67 | 64.67 | 64.67 | 64.67 |
| Total | 100.07 | 100.07 | 100.07 | 100.07 | 100.22 | 100.22 | 100.22 | 100.22 | 100.10 | 100.10 | 100.10 | 100.10 | 100.17 | 100.17 | 100.17 | 100.17 |

*All compositions are for the coated and dried photopolymer films (with substantially all of the coating solvent(s) having been removed)

What is claimed is:

1. A process for producing a resist image having good sidewall geometry upon imagewise exposure and subsequent development, which comprises the steps of:
   (1) preparing a photopolymerizable element comprising a support and photopolymerizable composition consisting essentially of:
      (a) a polymeric binder having weight average molecular weight in the range of 20,000 to 160,000, the polymeric binder comprising a polymer having the formula:

$(A)_w(B)_x(C)_y(D)_z$ where A is a substituted or unsubstituted $C_4$–$C_6$ n-alkyl methacrylate, B is a substituted or unsubstituted $C_4$–$C_6$ n-alkyl acrylate, C is selected from the group consisting of methyl methacrylate and ethyl methacrylate, and D is selected from the group consisting of methacrylic acid and acrylic acid; and where w, x, y, and z are weight percentages of comonomers in the polymeric binder, w is 5 to 40%, x is 5 to 40%, y is 10 to 70%, and z is 10 to 30%;
      (b) at least one ethylenically unsaturated monomer; and
      (c) at least one component selected from the group consisting of a photoinitiator or photoinitiator system;
   with the proviso that the photopolymerizable composition does not contain a basic compound used for the neutralization or partial neutralization of component (a);
   (2) applying the photopolymerizable element to a copper clad substrate such that the photopolymerizable composition is in contact with the copper;
   (3) imagewise exposing the photopolymerizable element to actinic radiation to afford an imagewise exposed photopolymerized element; and
   (4) developing the imagewise exposed photopolymerized element of step (3) to form a resist image on the copper clad substrate having good sidewall geometry.

2. The process of claim 1 wherein A is n-butyl methacrylate, B is n-butyl acrylate, C is methyl methacrylate, and D is methacrylic acid.

3. The process of claim 1 wherein the polymeric binder has weight average molecular weight in the range of 40,000 to 100,000, and wherein w is 10 to 40%, x is 10 to 20%, y is 30 to 60%, and z is 20 to 30%.

4. The process of claim 3 wherein the polymeric binder has weight average molecular weight in the range of 55,000 to 65,000, and wherein w is 22 to 27%, x is 15 to 20%, y is 30 to 40%, and z is 20 to 25%.

5. A relief image having good sidewall geometry made in accordance with a process selected from the group consisting of the process of claim 1.

6. The relief image of claim 5 which is an imaged photoresist pattern.

* * * * *